(12) United States Patent
Hara et al.

(10) Patent No.: US 8,847,700 B2
(45) Date of Patent: Sep. 30, 2014

(54) FILTER, DUPLEXER, COMMUNICATION MODULE, COMMUNICATION DEVICE

(75) Inventors: Motoaki Hara, Tokyo (JP); Takeshi Sakashita, Tokyo (JP); Masafumi Iwaki, Tokyo (JP); Jun Tsutsumi, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/565,173

(22) Filed: Aug. 2, 2012

(65) Prior Publication Data
US 2012/0293277 A1 Nov. 22, 2012

Related U.S. Application Data

(63) Continuation of application No. PCT/JP2011/050245, filed on Jan. 11, 2011.

(30) Foreign Application Priority Data

Feb. 4, 2010 (JP) .................................. 2010-023111

(51) Int. Cl.
| | | |
|---|---|---|
| H03H 9/70 | (2006.01) | |
| H03H 9/72 | (2006.01) | |
| H03H 9/54 | (2006.01) | |
| H03H 9/64 | (2006.01) | |
| H03H 9/13 | (2006.01) | |
| H03H 9/05 | (2006.01) | |
| H03H 9/60 | (2006.01) | |
| H03H 9/00 | (2006.01) | |

(52) U.S. Cl.
CPC .............. *H03H 9/725* (2013.01); *H03H 9/132* (2013.01); *H03H 9/0023* (2013.01); *H03H 9/0576* (2013.01); *H03H 9/6483* (2013.01); *H03H 9/706* (2013.01); *H03H 9/605* (2013.01)
USPC ............ 333/133; 333/189; 333/193; 333/195

(58) Field of Classification Search
CPC . H03H 9/0023; H03H 9/0576; H03H 9/0571; H03H 9/132; H03H 9/54; H03H 9/568; H03H 9/605; H03H 9/6406; H03H 9/6423; H03H 9/6426; H03H 9/6483; H03H 9/706; H03H 9/725
USPC .............. 333/133, 189, 193–196; 310/313 B, 310/313 D
See application file for complete search history.

(56) References Cited

U.S. PATENT DOCUMENTS

| | | |
|---|---|---|
| 5,559,481 A | 9/1996 | Satoh et al. |
| 5,999,069 A | 12/1999 | Ushiroku |

(Continued)

FOREIGN PATENT DOCUMENTS

| | | |
|---|---|---|
| JP | H10-126212 A | 5/1998 |
| JP | 11-055067 A | 2/1999 |

(Continued)

OTHER PUBLICATIONS

Written Opinion (PCT/ISA/237) issued in PCT/JP2011/050245 mailed in Mar. 2011. (Cited references have been submitted in a previous IDS.).
International Search Report (ISR) issued in PCT/JP2011/050245 mailed in Mar. 2011.
Singapore Examination Report dated Sep. 18, 2013, in a counterpart Singapore Patent Application No. 201205728-7.

(Continued)

*Primary Examiner* — Barbara Summons
(74) *Attorney, Agent, or Firm* — Chen Yoshimura LLP

(57) ABSTRACT

The filter includes one or more series resonators and one or more parallel resonators. An inductance is connected in series to at least a parallel resonator of the parallel resonators, and a antiresonance frequency of the parallel resonator to which the inductance is connected in series is equal to or higher than that of the series resonators. The duplexer, the communication module and the communication device are provided with the filter.

7 Claims, 20 Drawing Sheets

(56) References Cited

U.S. PATENT DOCUMENTS

| | | | |
|---|---|---|---|
| 6,407,649 B1 * | 6/2002 | Tikka et al. | 333/133 |
| 6,472,954 B1 * | 10/2002 | Ruby et al. | 333/133 |
| 6,677,835 B2 * | 1/2004 | Noguchi et al. | 333/193 |
| 6,995,631 B2 * | 2/2006 | Taniguchi | 333/133 |
| 8,125,298 B2 * | 2/2012 | Hara et al. | 333/133 |
| 2004/0058664 A1 * | 3/2004 | Yamamoto et al. | 455/339 |
| 2007/0268092 A1 | 11/2007 | Inoue et al. | |
| 2008/0116993 A1 * | 5/2008 | Yamakawa et al. | 333/124 |
| 2009/0256649 A1 | 10/2009 | Taniguchi | |
| 2009/0322444 A1 | 12/2009 | Tanaka | |
| 2010/0110940 A1 * | 5/2010 | Hara et al. | 370/277 |

FOREIGN PATENT DOCUMENTS

| | | |
|---|---|---|
| JP | 2007-312324 A | 11/2007 |
| JP | 2010-011300 A | 1/2010 |
| WO | 2008/072439 A1 | 6/2008 |
| WO | WO 2009/025055 A1 * | 2/2009 |

OTHER PUBLICATIONS

Japanese Office Action dated Feb. 4, 2014, in a counterpart Japanese patent application No. 2011-552717. (Partial translation of the Office Action is attached as a concise explanation of relevance.).

Japanese Office Action dated Jul. 1, 2014, in a counterpart Japanese patent application No. 2011-552717.

* cited by examiner

Frequency characteristics of resonators

Frequency characteristics of respective resonators

Attenuation characteristics

Reflection characteristics

Frequency characteristics of respective resonators
(Expanding frequency difference between the resonators)

Attenuation characteristics

Reflection characteristics

Frequency characteristics of respective resonators
(Connecting inductances to the resonators)

Attenuation characteristics

Reflection characteristics

Frequency characteristics of respective resonators

Attenuation characteristics

FILTER, DUPLEXER, COMMUNICATION MODULE, COMMUNICATION DEVICE

CROSS-REFERENCE TO RELATED APPLICATION

This application is a continuation of International Application No. PCT/JP2011/050245, filed on Jan. 11, 2011 and is based upon and claims the benefit of priority of the prior Japanese Patent Application No. 2010-023111, filed on Feb. 4, 2010, the entire contents of which are incorporated herein by reference.

FIELD

The disclosure of the present application relates to a filter, a duplexer, a communication module and a communication device.

BACKGROUND

Due to a rapid spread of wireless devices represented by mobile phones, demands for duplexers have been increasing rapidly. Particularly, there are strong demands for duplexers that use compact acoustic wave elements having high steepness.

The duplexers include a transmission filter and a reception filter. The transmission filter and the reception filter are required to have characteristics of low loss, high suppression and wide bandwidth. Especially, increasing the bandwidth of the filters has been strongly desired along with the recent demands for high-speed, large-capacity communication.

As a method for realizing the filters using acoustic wave elements, ladder filters have been used widely. The ladder filter is a high-frequency filter configured by connecting a plurality of resonators having different resonance frequencies in a ladder shape.

For increasing the bandwidth of the ladder filter, it is in principle possible to shift the resonance frequencies of the resonators to the lower frequency side by connecting inductances to the resonators. Thereby, an apparent frequency difference between the resonance frequency and antiresonance frequency can be expanded, which allows the filter to have a wider bandwidth. Patent Document 1 discloses a configuration in which the difference between the resonance frequency and the antiresonance frequency is expanded by connecting an inductance to each of series resonators and parallel resonators in series, so that wider passband characteristics can be obtained without causing degradation in the middle band.

Patent Document 1: JP 10 (1998)-126212 A

However, the inventors realized that in the configuration disclosed in Patent Document 1, since inductances are connected to respective resonators, many inductances need be provided along with an increase in the number of filter stages, which prevents a filter chip from being compact. The inventors thought that by connecting inductances only to the parallel resonators, the chip can be made compact. However, in this case, an increase in the bandwidth is limited by the difference between the resonance frequency and the antiresonance frequency of the series resonator, which makes it difficult to sufficiently increase the bandwidth.

SUMMARY

The present application discloses a example of filter that includes: one or more series resonators; one or more parallel resonators; and an inductance that is connected in series to at least one of the parallel resonators. An antiresonance frequency of the parallel resonator to which the inductance is connected in series is equal to or higher than an antiresonance frequency of at least one of the series resonators.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

EMBODIMENT 1

[1. Configurations of Filter and Duplexer]

Figure 1A:
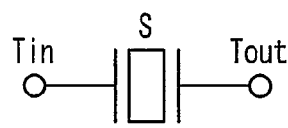
FIG. 1A is a circuit diagram of an example of a series resonator.
Figure 1B:
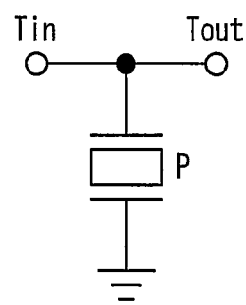
FIG. 1B is a circuit diagram of an example of a parallel resonator.
Figure 1C:
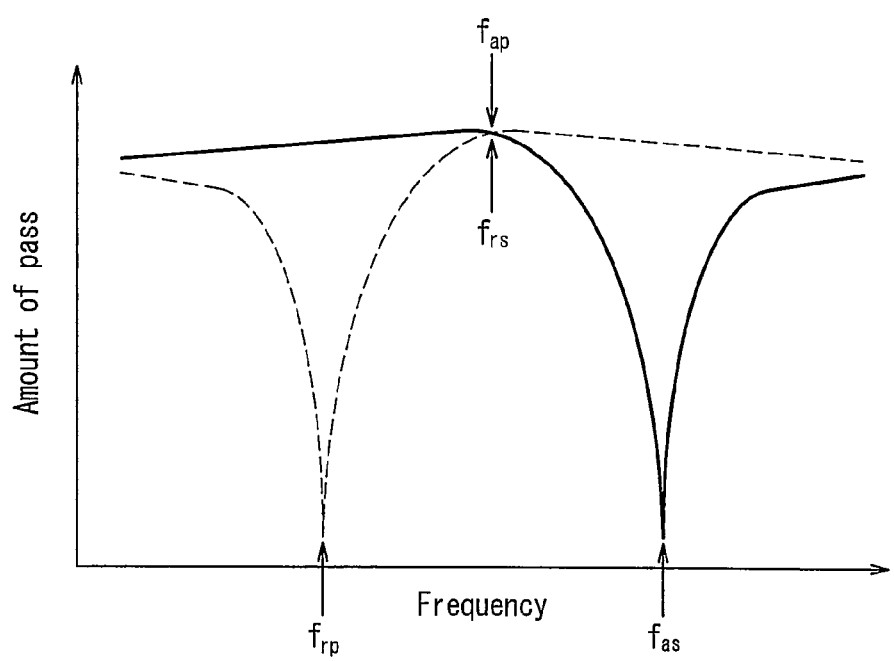
FIG. 1C is a characteristic diagram showing an example of frequency characteristics of the resonators.

FIG. 1A is a circuit diagram of a series resonator in a ladder filter. FIG. 1B is a circuit diagram of a parallel resonator in the ladder filter. FIG. 1C shows frequency characteristics of the series resonator and the parallel resonator. A solid line in FIG. 1C indicates frequency characteristics of a series resonator S shown in FIG. 1A. A dashed line indicates frequency characteristics of a parallel resonator P shown in FIG. 1B.

As shown in FIG. 1C, the series resonator S has a resonance frequency $f_{rs}$ and an antiresonance frequency $f_{as}$. The parallel resonator P has a resonance frequency $f_{rp}$ and an antiresonance frequency $f_{ap}$. Here, when the antiresonance frequency $f_{ap}$ of the parallel resonator P and the resonance frequency $f_{rs}$ of the series resonator S are substantially equal to each other, and the series resonator S is disposed in a series arm (a signal line that is connected between an input terminal $T_{in}$ and an output terminal $T_{out}$) and the parallel resonator P is disposed in a parallel arm (a signal line that is connected between the series arm and a ground) as shown in FIG. 2A, it is possible to realize a filter having filter characteristics as shown in FIG. 2B.

Figure 2A:
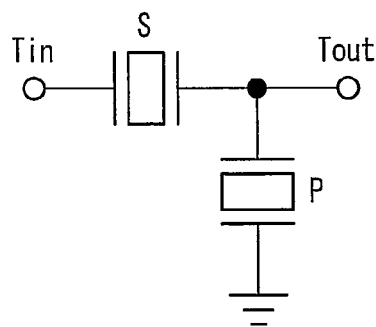
FIG. 2A is a circuit diagram of an example of a ladder filter.
Figure 2B:
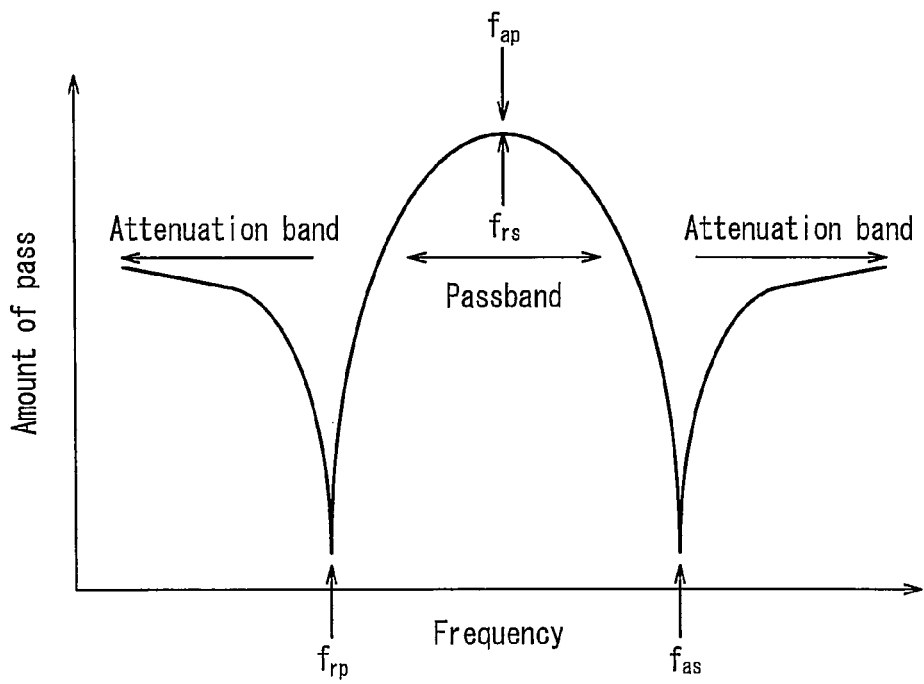
FIG. 2B is a characteristic diagram showing an example of frequency characteristics of the resonators.
Figure 3A:
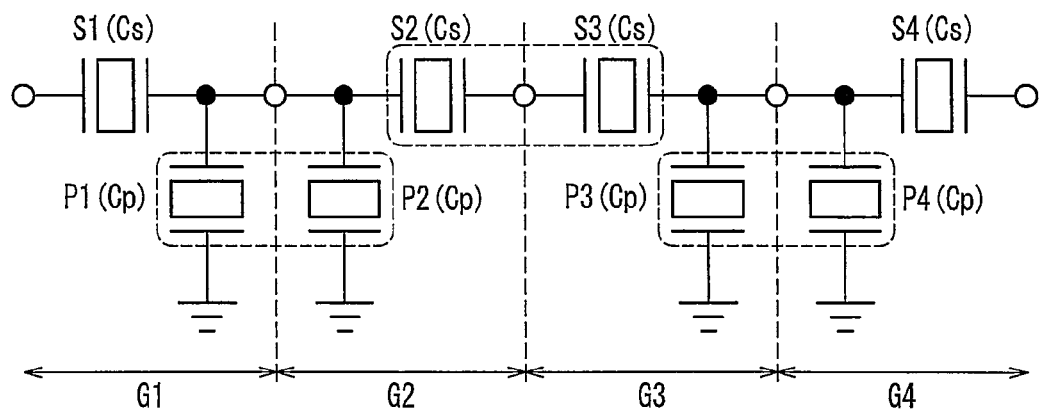
FIG. 3A is a circuit diagram of an example of a ladder filter.

As shown in FIG. 3A, a ladder filter has a configuration in which pairs of ladder circuits (each pair is a combination of one series resonator and one parallel resonator) shown in FIG. 2A are connected to each other in multiple stages (G1-G4). In the ladder filter shown in FIG. 3A, series resonators S1-S4 each having a capacity Cs are connected to the series arm, and parallel resonators P1-P4 each having a capacity Cp are connected to the parallel arms. At this time, in order to prevent reflections between the respective stages, the ladder circuits are connected in a mirror-image form as shown in FIG. 3A. For example, a node between the series arm and the parallel arm in the ladder circuit of the first stage G1 and a node between the series arm and the parallel arm in the ladder circuit of the second stage G2 are arranged next to each other. Further, the series resonator S2 in the second stage G2 and the series resonator S3 in the third stage G3 is connected next to each other. The third stage G3 and the fourth stage G4 are connected to each other to have the same connection relationship as that described above.

Figure 3B:
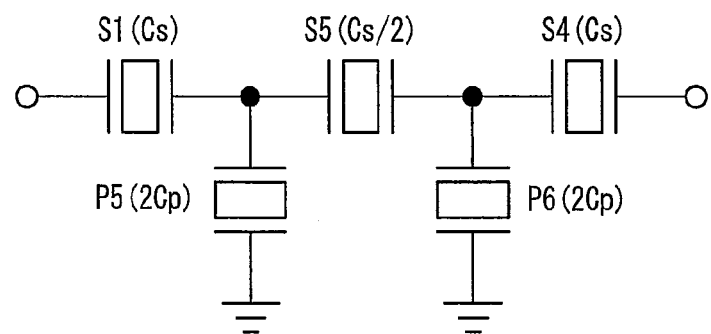
FIG. 3B is a circuit diagram of an example of a ladder filter.

When the ladder circuits are connected in multiple stages as shown in FIG. 3A, there are a section where the same type of the resonators are connected in series in the series arm and a section where the same type of the resonators are connected in parallel in the parallel arms. In the actual ladder filter, these resonators can be combined capacitively into one resonator for downsizing the filter circuit. FIG. 3B is a circuit diagram of a ladder filter in which adjacent resonators are combined capacitively. As shown in FIG. 3B, the series resonators S2 and S3 in FIG. 3A can be replaced by a series resonator S5 having a combined capacity Cs/2 that is a synthesis capacity of the respective capacities Cs. Further, as shown in FIG. 3B, the parallel resonators P1 and P2 in FIG. 3A can be replaced by a parallel resonator P5 having a combined capacity 2 Cp that is a synthesis capacity of the respective capacities Cp. Moreover, as shown in FIG. 3B, the parallel resonators P3 and P4 in FIG. 3A can be replaced by a parallel resonator P6 having a combined capacity 2 Cp that is a synthesis capacity of the respective capacities Cp.

Figure 4A:
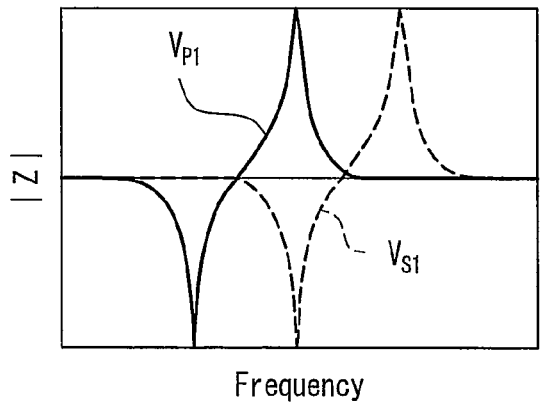
FIG. 4A is a characteristic diagram showing an example of frequency characteristics of resonators.
Figure 4B:
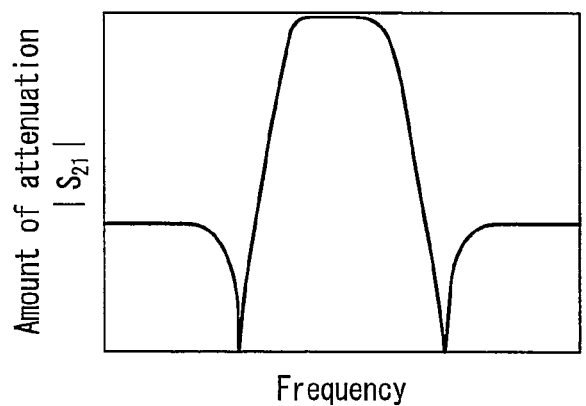
FIG. 4B is a characteristic diagram showing an example of attenuation characteristics of the resonators.
Figure 4C:
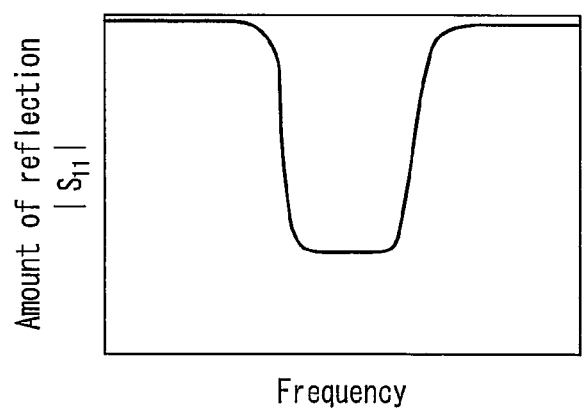
FIG. 4C is a characteristic diagram showing an example of reflection characteristics of the resonators.
Figure 4D:
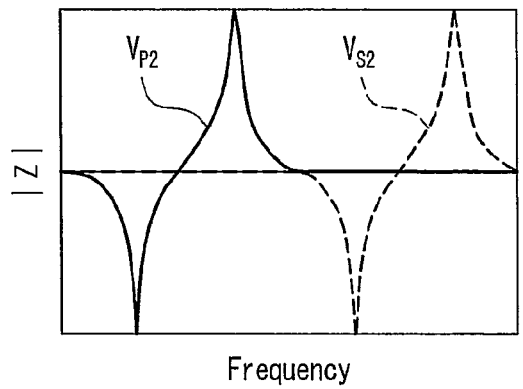
FIG. 4D is a characteristic diagram showing an example of frequency characteristics of resonators.
Figure 4E:
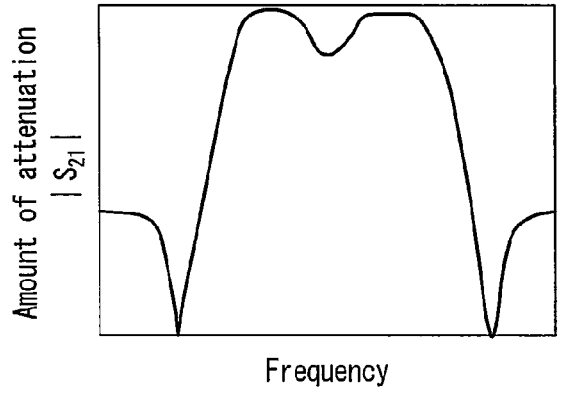
FIG. 4E is a characteristic diagram showing an example of attenuation characteristics of the resonators.
Figure 4F:
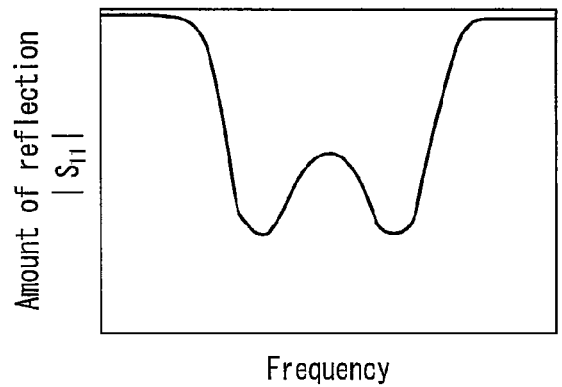
FIG. 4F is a characteristic diagram showing an example of reflection characteristics of the resonators.
Figure 4G:
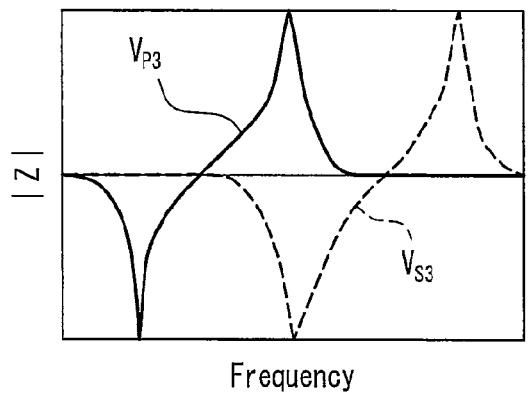
FIG. 4G is a characteristic diagram showing an example of frequency characteristics of the resonators.
Figure 4H:
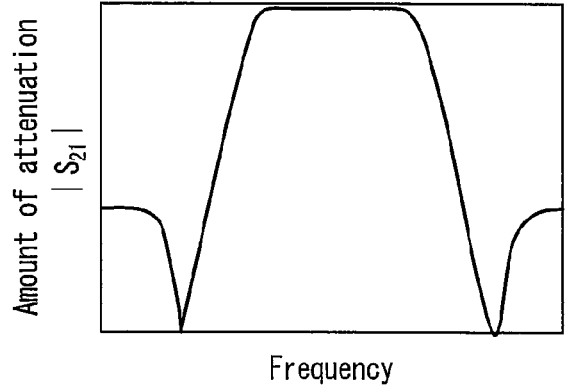
FIG. 4H is a characteristic diagram showing an example of attenuation characteristics of the resonators.
Figure 4I:
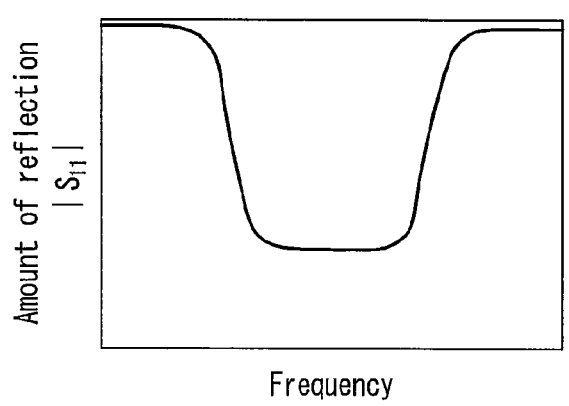
FIG. 4I is a characteristic diagram showing an example of reflection characteristics of the resonators.

FIG. 4A shows frequency characteristics of a series resonator (frequency characteristic $V_{s1}$) and a parallel resonator (frequency characteristic $V_{p1}$) before expanding a frequency difference therebetween. FIG. 4B shows attenuation characteristics of a filter that includes resonators having the frequency characteristics shown in FIG. 4A. FIG. 4C shows reflection characteristics of the filter that includes resonators having the frequency characteristics shown in FIG. 4A. FIG. 4D shows frequency characteristics of the series resonator and the parallel resonator after expanding frequency differences between the resonance/antiresonance frequencies of the series resonator and the resonance/antiresonance frequencies of the parallel resonator, as compared with the frequency characteristics shown in FIG. 4A. FIG. 4E shows attenuation characteristics of a filter that includes resonators having the frequency characteristics shown in FIG. 4D. FIG. 4F shows reflection characteristics of the filter that includes resonators having the frequency characteristics shown in FIG. 4D. FIG. 4G shows frequency characteristics of the series resonator and the parallel resonator after shifting the resonance frequency of the series resonator and the resonance frequency of the parallel resonator to the lower frequency side, as compared with the frequency characteristics shown in FIG. 4D. FIG. 4H shows attenuation characteristics of a filter that includes resonators having the frequency characteristics shown in FIG. 4G. FIG. 4I shows reflection characteristics of the filter that includes resonators having the frequency characteristics shown in FIG. 4G.

In the ladder filter, the passband can be increased by expanding the frequency difference between the series resonator and the parallel resonator. For example, in the filter having the characteristics shown in FIGS. 4A-4C, the series resonator having the characteristic $V_{s1}$ in FIG. 4A may be replaced by a series resonator having characteristic $V_{s2}$ in FIG. 4D, and the parallel resonator having the characteristic $V_{p1}$ in FIG. 4A may be replaced by a parallel resonator having characteristic $V_{p2}$ in FIG. 4D. However, in this method, impedance matching cannot be ensured, which causes large input loss substantially in the middle of the passband as shown in FIGS. 4E and 4F.

A difference between the resonance frequency and the antiresonance frequency of the resonator is determined depending on a coupling coefficient of the resonator itself. Therefore, it is difficult to reduce the loss of filter characteristics simply by expanding the frequency difference between the series resonator and the parallel resonator.

To cope with this, the inventors recognized that it is in principle possible to shift the resonance frequency to the lower frequency side by connecting an inductance to the resonator. Thereby, the apparent frequency difference between the resonance frequency and the antiresonance frequency can be expanded. For example, when an inductance is connected in series to each of the series resonator and the parallel resonator for expanding the difference between the resonance frequency and the antiresonance frequency, the resonators will have frequency characteristics as shown in FIG. 4G. By producing a filter using such resonators, the filter can obtain wideband characteristics without causing degradation substantially in the middle of the frequency band as shown in FIGS. 4H and 4I.

However, the inventors recognized that in the method in which the bandwidth is increased by connecting inductances to the resonators, inductances are connected to the respective resonators. Therefore, many inductances need be provided along with an increase in the number of filter stages, which prevents a filter chip from being compact. The inventors found that by connecting inductances only to the parallel resonators, the number of the inductances can be reduced and the chip can be made compact. However, in this case, an increase in the bandwidth is limited by the difference between the resonance frequency and the antiresonance frequency of the series resonator, which makes it difficult to sufficiently increase the bandwidth.

EXAMPLE 1

Figure 5A:
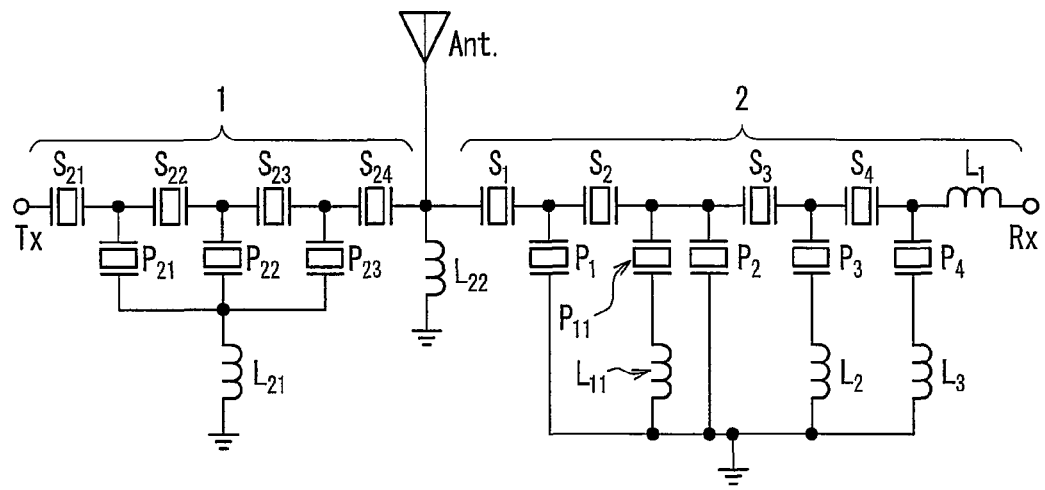
FIG. 5A is a circuit diagram of an example of a duplexer according to Embodiment.

FIG. 5A is a circuit diagram of a duplexer according to Example 1. The duplexer shown in FIG. 5A is provided with a transmission filter 1 and a reception filter 2. The transmission filter 1 and the reception filter 2 include ladder filters. The reception filter 2 includes series resonators S1-S4, parallel resonators P1-P4 and inductances L1-L3. An output side of the transmission filter 1 and an input side of the reception filter 2 are connected to an antenna Ant. An input side of the transmission filter 1 is connected to a transmission terminal Tx. An output side of the reception filter 2 is connected to a reception terminal Rx. Here, the series resonators S1-S4 and the parallel resonators P1-P4 can be realized using film bulk acoustic resonators that use aluminum nitride as a piezoelectric film.

Figure 5B:
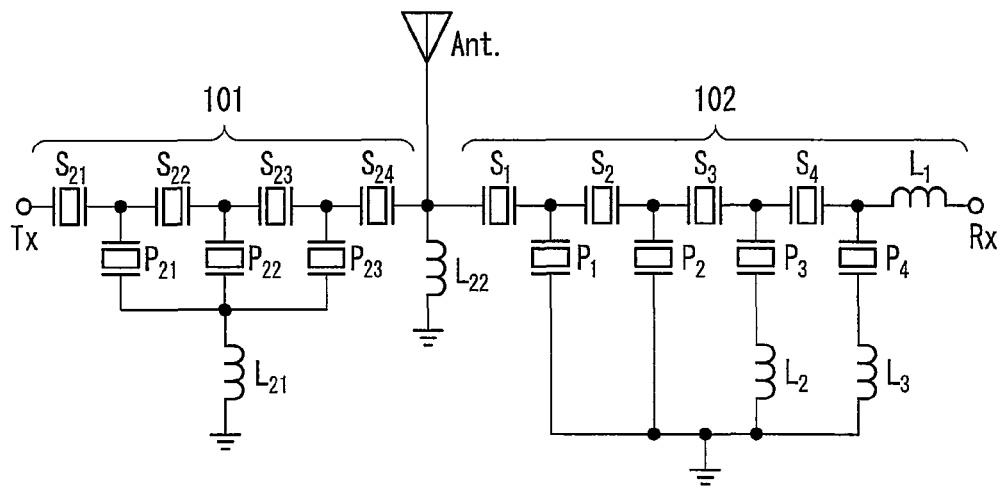
FIG. 5B is a circuit diagram of an example of a duplexer for comparison.

The reception filter 2 shown in FIG. 5A is further provided with a parallel resonator P11 and an inductance L11. The parallel resonator P11 is connected to a parallel arm. An antiresonance frequency of the parallel resonator P11 coincides with antiresonance frequencies of the series resonators S1-S4. The inductance L11 is connected in series to the parallel resonator P11. By connecting the inductance L11 in series to the parallel resonator P11, a resonance frequency of the parallel resonator P11 is adjusted to be lower than resonance frequencies of the parallel resonators P1-P4. A reception filter 102 shown in FIG. 5B is an example in which the parallel resonator P11 and the inductance L11 are removed from the configuration of FIG. 5A for comparison.

Figure 6A:
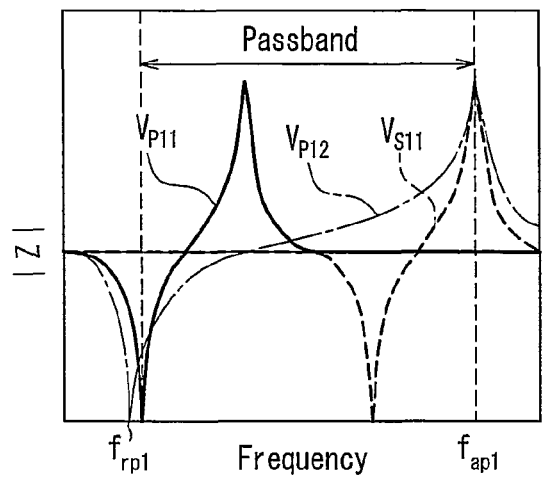
FIG. 6A is a characteristic diagram showing an example of frequency characteristics of resonators.
Figure 6B:
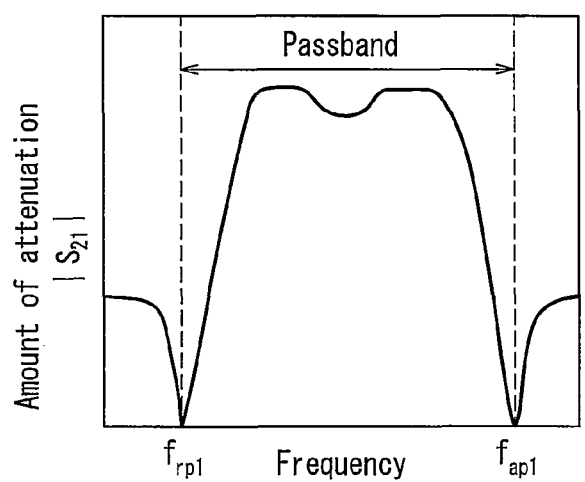
FIG. 6B is a characteristic diagram showing an example of attenuation characteristics of the resonators.

FIG. 6A shows frequency characteristics of the series resonators S1-S4 and the parallel resonators P1-P4 in FIG. 5A, and frequency characteristics of the parallel resonator P11 to which the inductance L11 is connected. FIG. 6B shows attenuation characteristics of a filter provided with resonators having characteristics shown in FIG. 6A. In FIG. 6A, characteristic $V_{s11}$ is the frequency characteristics of the series resonators S1-S4. Characteristic $V_{p11}$ is the frequency characteristics of the parallel resonators P1-P4. Characteristic $V_{p12}$ is the frequency characteristics of the parallel resonator P11. As shown in FIG. 6A, a passband of the filter is included between a resonance frequency $f_{rp1}$ and an antiresonance frequency $f_{ap1}$ of the parallel resonator P11 to which the inductance L11 is connected in series. A frequency band that is sandwiched between the resonance frequency $f_{rp1}$ and the antiresonance frequency $f_{ap1}$ is a region where a phase of a reflection coefficient in the resonator changes from 0 to 180 degrees. Therefore, a two-terminal element that includes the parallel resonator P11 and the inductance L11 connected each other operates as an impedance matching box in the frequency band sandwiched between the resonance frequency $f_{rp1}$ and the antiresonance frequency $f_{ap1}$. Thereby, the impedance can be matched substantially in the middle of the passband in FIG. 6A, and thus it is possible to suppress the degradation substantially in the middle of the passband as shown in FIG. 6B.

Figure 7:
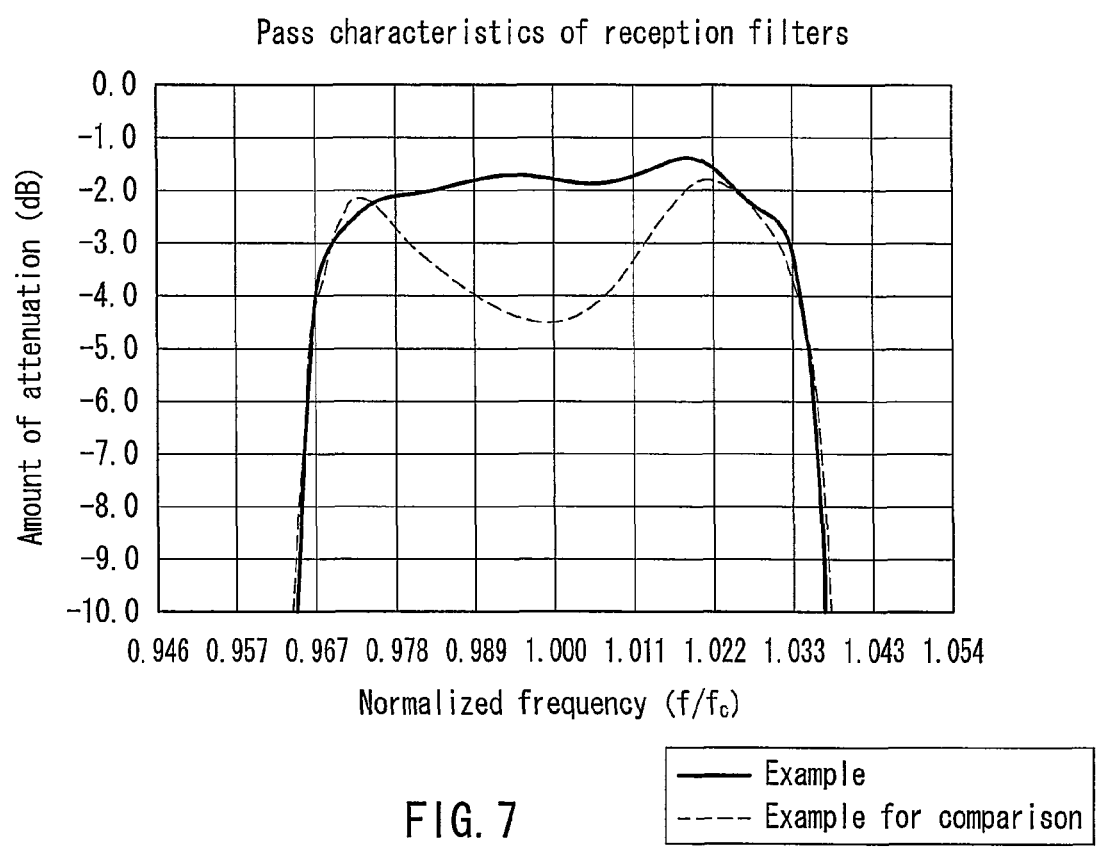
FIG. 7 is a characteristic diagram showing an example of pass characteristics of reception filters.

FIG. 7 shows pass characteristics of reception filters. In FIG. 7, a solid line indicates reception characteristics of the reception filter 2 (Example) shown in FIG. 5A. A dashed line indicates reception characteristics of the reception filter (Example for comparison) shown in FIG. 5B. In other words, the solid line shows characteristics of the reception filter to which the parallel resonator P11 and the inductance L11 are added as the impedance matching box. Values represented by horizontal axes in FIG. 7 are normalized by the center frequency of the reception filter. As an example, a fractional bandwidth of the filter is 6%. By adding the impedance matching box to the reception filter 2, the impedance mismatching substantially in the middle of the passband is improved as shown in FIG. 7, which makes it possible to realize sufficiently flat filter characteristics even in the bandwidth where the fractional bandwidth is 6%. Here, for example, a capacitance of the parallel resonator P11 and the inductance L11 can be set at 2.3 pF and 3 nH, respectively, and a resonance point and an antiresonance point of the parallel arm that connects the P11 and the L11 in series can be set at 0.511 and 1.033, respectively, at the normalized frequency. The antiresonance point can coincide with antiresonance points of the series resonators that constitute the filter, and the resonance point can be arranged at a frequency that is sufficiently lower than the passband. Therefore, in the passband of the filter, the parallel resonator P11 functions simply as a reactance element and functions merely as an impedance matching element.

In the present example, although the antiresonance frequency of the parallel resonator P11 coincides with the antiresonance frequencies of the series resonators S1-S4, the antiresonance frequency of the parallel resonator P11 may be higher than the antiresonance frequencies of the series resonators S1-S4. This case also allows the passband of the filter to be included between the resonance frequency and the antiresonance frequency of the parallel resonator P11. Incidentally, in the film bulk acoustic resonator whose resonance frequency is controlled depending on the thickness of the constituent layers, it is difficult to independently adjust frequencies of the respective resonators included in the filter. Therefore, the configuration in which the antiresonance frequency of the parallel resonator P11 coincides with the antiresonance frequencies of the series resonators S1-S4 and the resonance frequency of the parallel resonator P11 is shifted by the inductance L11 is advantageous in terms of the production process.

Further, in the present example, although the resonators are realized using the film bulk acoustic resonators, the same consideration is applicable to surface acoustic wave elements, Love wave elements, and Lamb wave elements. Frequencies of these elements can be adjusted by changing a pitch of an IDT (InterDigital Transducer) electrode. Unlike the film bulk acoustic resonator, the resonators whose frequencies are controlled by the IDT pitch are not constrained by the adjustment of frequencies depending on the thickness of the constituent layers. In this case, since a high frequency edge of the passband of the filter is defined by the antiresonance frequency of the resonator having the lowest resonance frequency among the series resonators, it is preferable that the antiresonance frequency of the parallel resonator P11 for impedance matching is made to coincide with, or adjusted to be higher than the antiresonance frequency of the resonator having the lowest resonance frequency among the series resonators. Further, since a low frequency edge of the passband of the filter is defined by the resonance frequency of the resonator having the highest resonance frequency among the parallel resonators, it is preferable that the resonance frequency of the parallel resonator P11 for impedance matching is made to coincide with, or adjusted to be lower than the resonance frequency of the resonator having the highest resonance frequency among the parallel resonators.

Further, in the present example, although the duplexer is used for description as shown in FIG. 5A, the same effect as that obtained in the present example can be obtained also in the case of using the reception filter alone.

Further, in the present example, although the ladder filter is used for description as shown in FIG. 5A, the same effect as that obtained in the present example can be obtained also in a lattice filter that connects series resonators and parallel resonators in a lattice shape.

When the plurality of series resonators S1-S4 have resonance frequencies different from each other, it is preferable that the antiresonance frequency of the parallel resonator P11 to which the inductance L11 is connected in series is equal to or higher than an antiresonance frequency of the series resonator having the lowest resonance frequency among the plurality of series resonators S1-S4.

When the plurality of parallel resonators P1-P4 have resonance frequencies different from each other, it is preferable that the resonance frequency of the parallel resonator P11 that is shifted by the inductance L11 is equal to or lower than a resonance frequency of the parallel resonator having the highest resonance frequency among the plurality of parallel resonators P1-P4.

Figure 8:
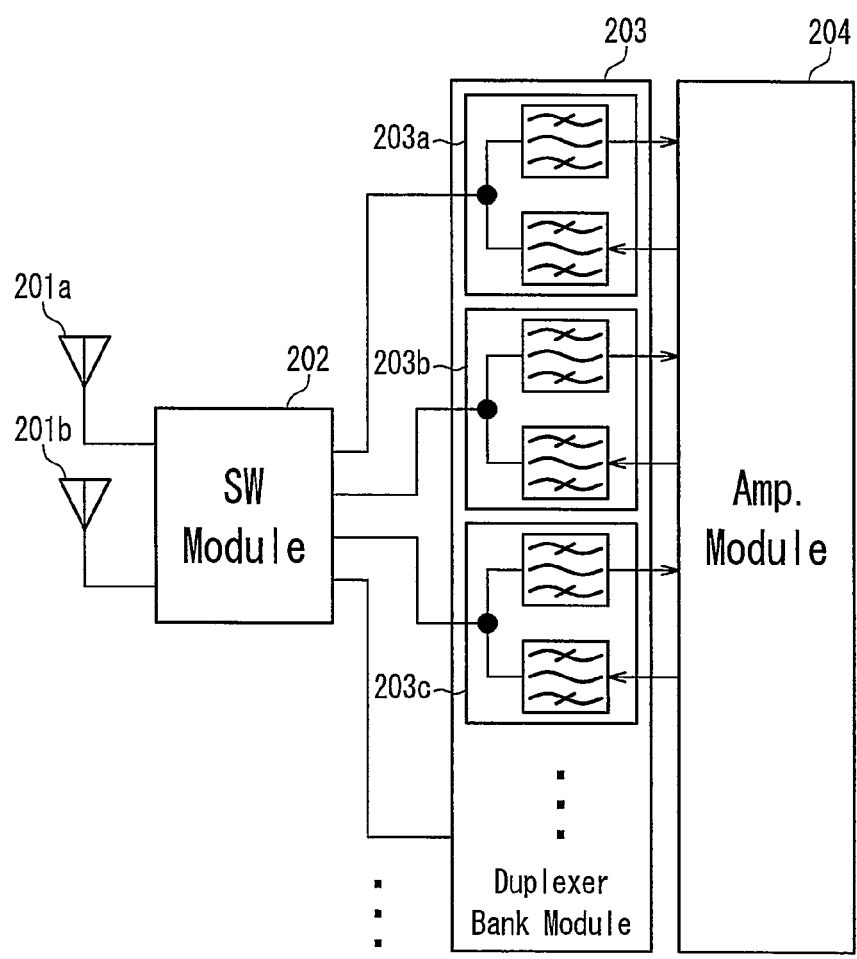
FIG. 8 is a block diagram of an example of a RF module provided with the duplexer according to Embodiment.

FIG. 8 shows an exemplary RF module provided with the duplexer according to the present embodiment. The RF module shown in FIG. 8 includes a switch (SW) module 202, a duplexer bank module 203 and an amplifier (AMP) module 204. The duplexer bank module 203 includes a plurality of duplexers 203a-203c. The switch module 202 is connected to antennas 201a and 201b, and properly selects one of the plurality of duplexers 203a-203c included in the duplexer bank module 203 for exchanging transmission signals and reception signals. Although, in FIG. 8, the duplexers are part of the duplexer bank module 203, they may be incorporated into the amplifier module 204 or the switch module 202 to be formed into one module, for example.

EXAMPLE 2

Figure 9A:
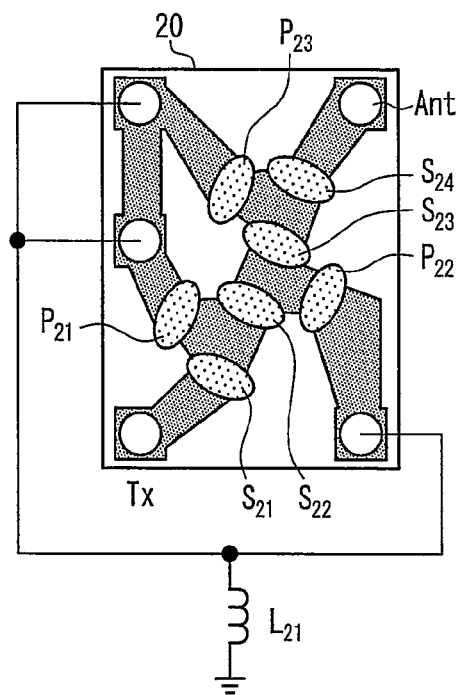
FIG. 9A is a schematic diagram showing an example of a specific configuration of a transmission filter.
Figure 9B:
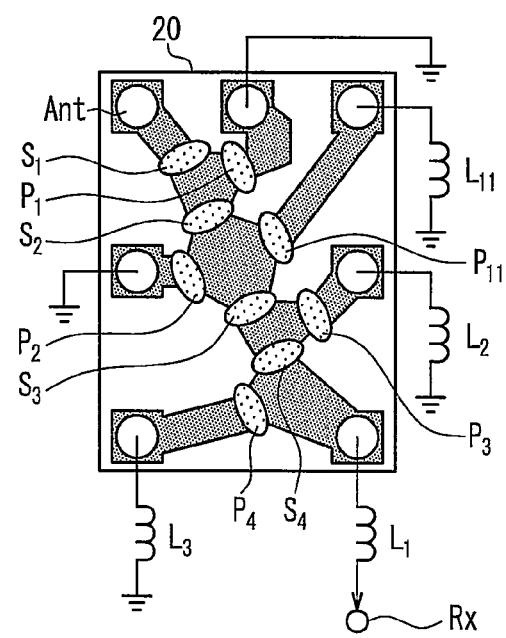
FIG. 9B is a schematic diagram showing an example of a specific configuration of a reception filter.

FIG. 9A is a schematic diagram showing a specific configuration of a transmission filter chip shown in FIG. 5A. FIG. 9B is a schematic diagram showing a specific configuration of a reception filter chip shown in FIG. 5A. As shown in FIGS. 9A and 9B, the transmission filter and the reception filter included in the duplexer can be formed as separate filter chips. Series resonators S21-S24, parallel resonators P21-P24 and an inductance L21 included in the transmission filter chip shown in FIG. 9A are denoted with the same reference numerals as those in FIG. 5A, so as to make the configuration shown in FIG. 9A consistent with the configuration shown in FIG. 5A. Further, the series resonators S1-S4, the parallel resonators P1-P4, the inductances L1-L3, the parallel resonator P11 and the inductance L11 included in the reception filter chip shown in FIG. 9B are denoted with the same reference numerals as those in FIG. 5A, so as to make the configuration shown in FIG. 9B consistent with the configuration shown in FIG. 5A.

In FIGS. 9A and 9B, the inductances L1-L3 and L21 can be realized using external components, or wiring on a package or a module substrate. The filter chips shown in FIGS. 9A and 9B can be formed by making film bulk acoustic resonators on a silicone substrate 20.

Figure 10A:
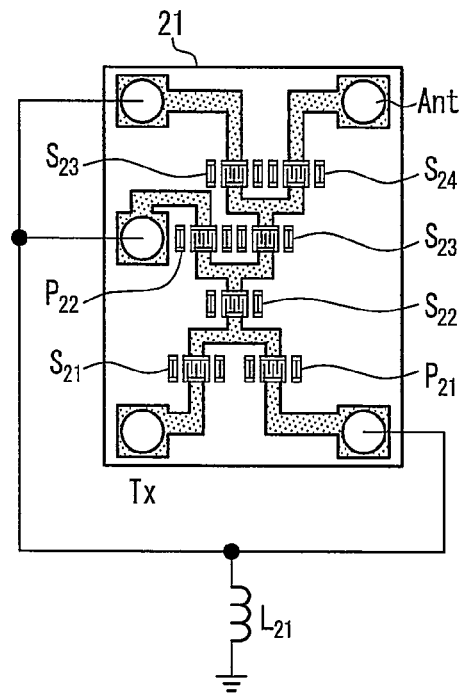
FIG. 10A is a schematic diagram showing an example of a specific configuration of a transmission filter.
Figure 10B:
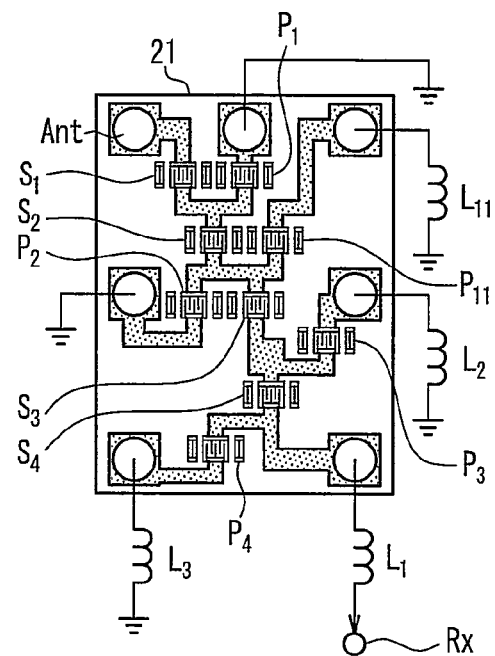
FIG. 10B is a schematic diagram showing an example of a specific configuration of a reception filter.

The filter chips can be realized using surface acoustic wave elements. FIG. 10A is a schematic diagram showing a transmission filter chip realized using surface acoustic wave elements as the resonators. FIG. 10B is a schematic diagram showing a reception filter chip realized using surface acoustic wave elements as the resonators. The series resonators S21-S24, the parallel resonators P21-P24 and the inductance L21 included in the transmission filter chip shown in FIG. 10A are denoted with the same reference numerals as those in FIG. 5A, so as to make the configuration shown in FIG. 10A consistent with the configuration shown in FIG. 5A. Further, the series resonators S1-S4, the parallel resonators P1-P4, the inductances L1-L3, the parallel resonator P11 and the inductance L11 included in the reception filter chip shown in FIG. 10B are denoted with the same reference numerals as those in FIG. 5A, so as to make the configuration shown in FIG. 10B consistent with the configuration shown in FIG. 5A. The filter chips shown in FIGS. 10A and 10B can be formed by wiring aluminum (Al) on a piezoelectric substrate 21.

Figure 11A:
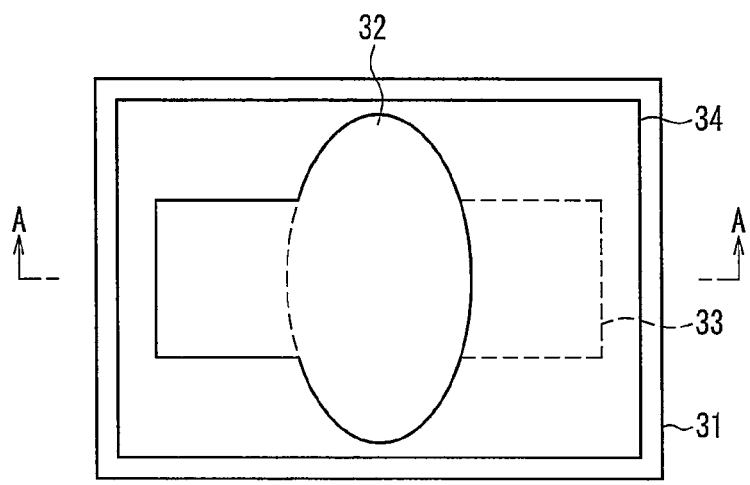
FIG. 11A is a plan view showing an example of a film bulk acoustic resonator.
Figure 11B:
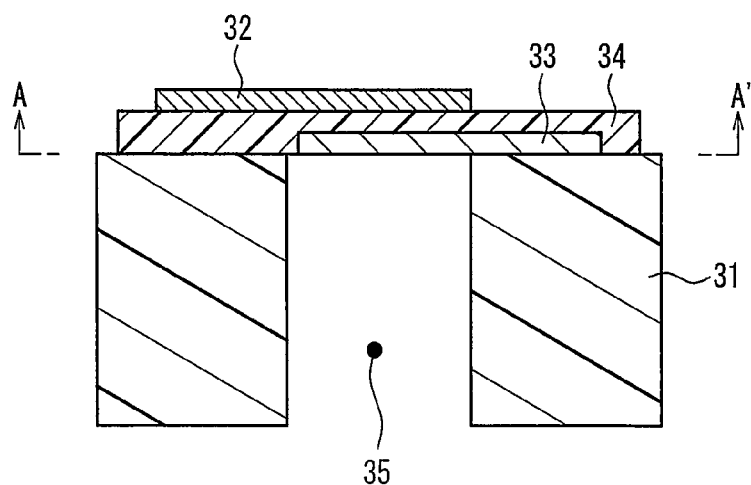
FIG. 11B is a cross-sectional view taken along a line A-A in FIG. 11A.

FIG. 11A is a plan view showing a specific configuration of a film bulk acoustic resonator. FIG. 11B is a cross-sectional view taken along a line A-A in FIG. 11A. As shown in FIGS. 11A and 11B, the film bulk acoustic resonator includes a substrate 31, a lower electrode 33 formed on the substrate 31, a piezoelectric film 34 formed on the lower electrode 33, and an upper electrode 32 formed on the piezoelectric film 34. In a region in the substrate 31 where the upper electrode 32 and the lower electrode 33 overlap with each other, a void 35 is formed.

Figure 12A:
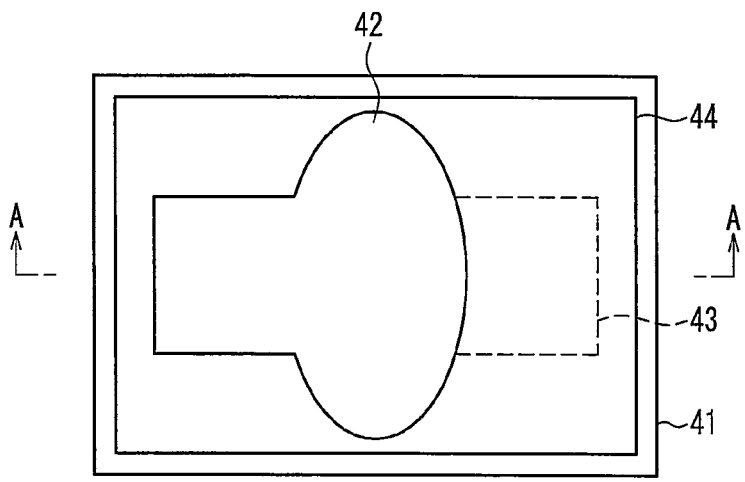
FIG. 12A is a plan view showing an example of a film bulk acoustic resonator.
Figure 12B:
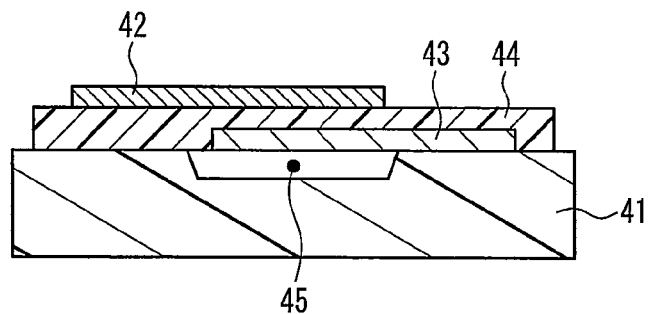
FIG. 12B is a cross-sectional view taken along a line A-A in FIG. 12A.
Figure 12C:
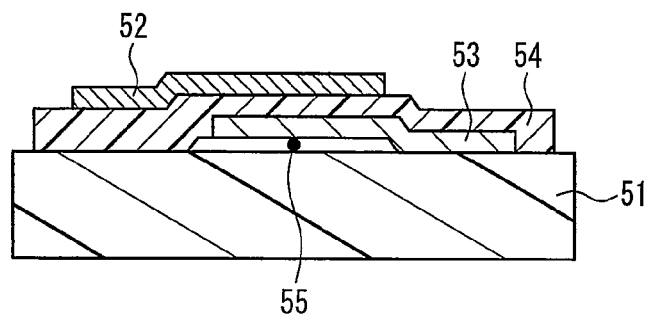
FIG. 12C is a cross-sectional view of an example of a film bulk acoustic resonator.
Figure 12D:
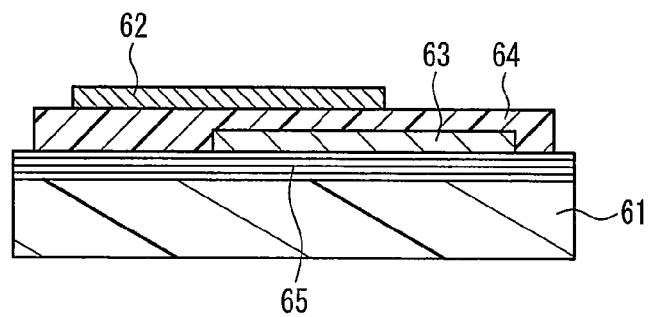
FIG. 12D is a cross-sectional view of an example of a film bulk acoustic resonator.

FIG. 12A is a plan view showing a specific configuration of another exemplary film bulk acoustic resonator. FIG. 12B is a cross-sectional view taken along a line A-A in FIG. 12A. As shown in FIGS. 12A and 12B, the film bulk acoustic resonator includes a substrate 41, a lower electrode 43 formed on the substrate 41, a piezoelectric film 44 formed on the lower electrode 43, and an upper electrode 42 formed on the piezoelectric film 44. In a region in the substrate 41 where the upper electrode 42 and the lower electrode 43 overlap with each other, a void 45 is formed. FIG. 12C is a cross-sectional view of a film bulk acoustic resonator in which the void 45 is not formed in the substrate 41 in the film bulk acoustic resonator shown in FIG. 12B, but a void 55 is formed between a substrate 51 and a lower electrode 53. The film bulk acoustic resonator shown in FIG. 12C includes the substrate 51, an upper electrode 52, the lower electrode 53 and a piezoelectric film 54. FIG. 12D is a cross-sectional view of a film bulk acoustic resonator in which reflection films 65 are formed in place of the void 45 in the film bulk acoustic resonator shown in FIG. 12B. The film bulk acoustic resonator shown in FIG. 12D includes a substrate 61, an upper electrode 62, a lower electrode 63, a piezoelectric film 64 and the reflection film 65.

Figure 13A:
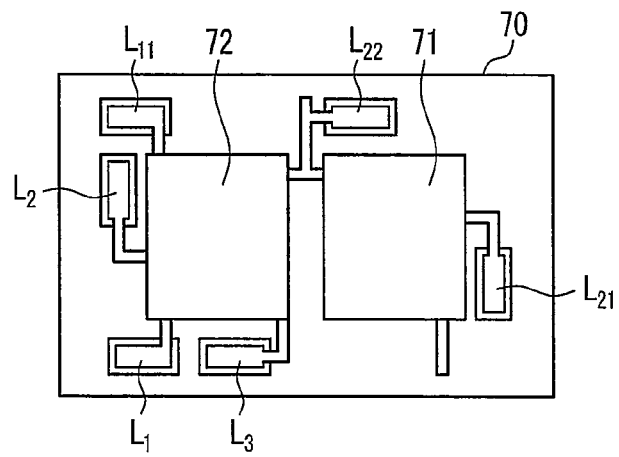
FIG. 13A is a schematic diagram showing an example of a specific configuration of a duplexer.
Figure 13B:
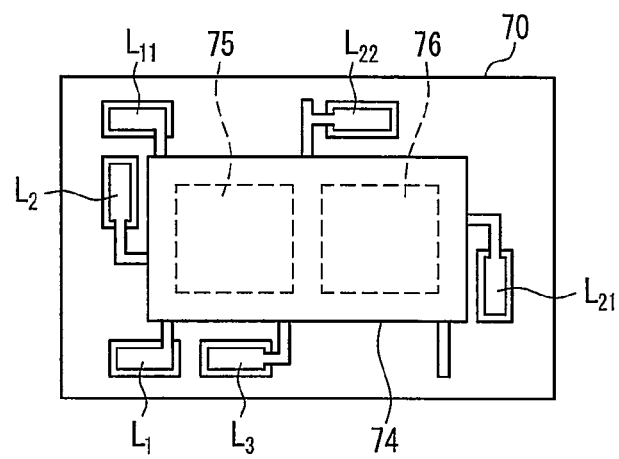
FIG. 13B is a schematic diagram showing an example of a specific configuration of a duplexer module.

FIGS. 13A and 13B are schematic diagrams showing specific configurations of duplexers. Since the filter chips include mechanically-driven parts, it is preferable to seal them hermetically. In the hermetically sealed configuration, the reception filter chip and the transmission filter chip may be hermetically sealed separately, or hermetically sealed together as a duplexer package. FIG. 13A shows a form in which a transmission filter package 71, a reception filter package 72 and inductances L1, L2, L3, L11, L21 are mounted on a substrate 70. FIG. 13B shows a form in which a duplexer package 74 and the inductances L1, L2, L3, L11, L21 are mounted on the substrate 70. The duplexer package 74 contains a transmission filter chip 75 and a reception filter chip 76.

Figure 14:
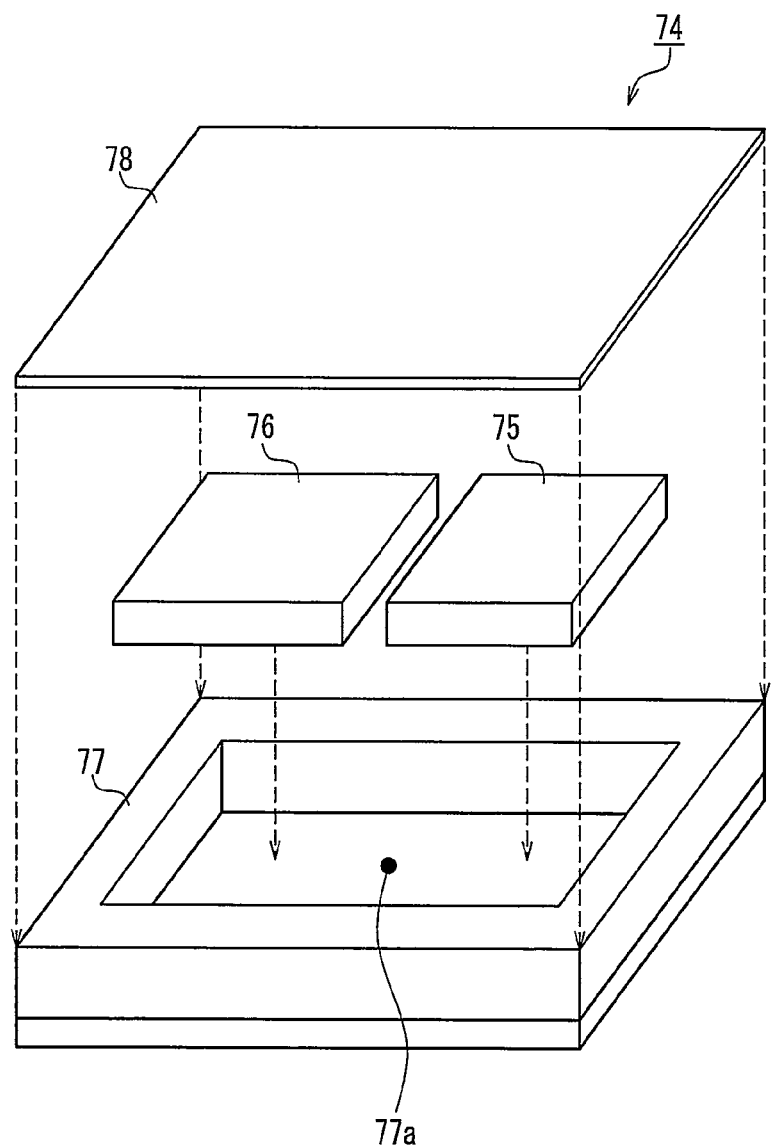
FIG. 14 is an exploded perspective view showing an example of a specific configuration of a duplexer module.

FIG. 14 is an exploded perspective view showing the duplexer package having the hermetically sealed configuration. As shown in FIG. 14, in the duplexer package, the transmission filter chip 75 and the reception filter chip 76 are mounted in a cavity 77a of a ceramic package 77 by flip chip bonding. By welding a substantially flat metallic cap 78 to the ceramic package 77, the cavity 77a can be sealed.

Figure 15A:
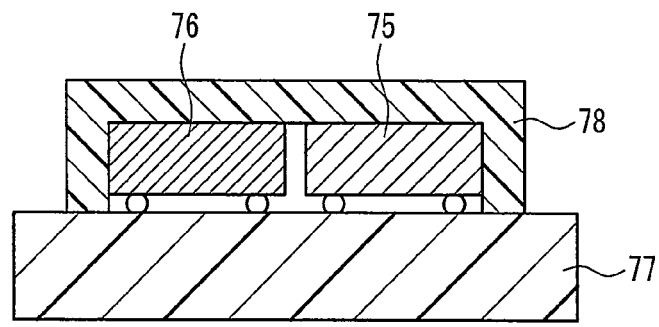
FIG. 15A is a schematic diagram showing an example of a specific configuration of a duplexer module.

FIG. 15A is a cross-sectional view of a duplexer package that is hermetically sealed by resin molding. In the duplexer package shown in FIG. 15A, the transmission filter chip 75 and the reception filter chip 76 are mounted on the ceramic package 77 by flip chip bonding. A resin mold 78 covers the transmission filter chip 75 and the reception filter chip 76. Thereby, the transmission filter chip 75 and the reception filter chip 76 can be sealed hermetically.

Figure 15B:
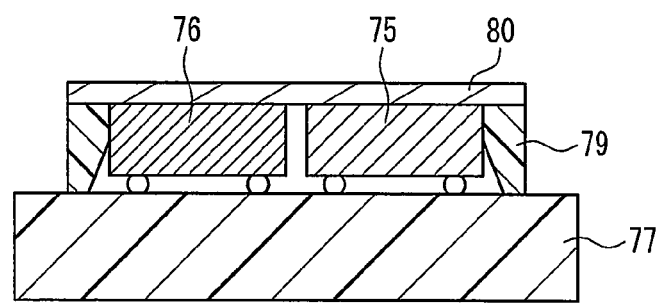
FIG. 15B is a schematic diagram showing an example of a specific configuration of a duplexer module.

FIG. 15B is a cross-sectional view of a duplexer package that is hermetically sealed by metallic molding. In the duplexer package shown in FIG. 15B, the transmission filter chip 75 and the reception filter chip 76 are mounted on the ceramic package 77 by flip chip bonding. A metallic mold 79 surrounds the transmission filter chip 75 and the reception filter chip 76, and a metallic lid 80 seals the upper portions. Thereby, the transmission filter chip 75 and the reception filter chip 76 can be sealed hermetically.

Figure 15C:
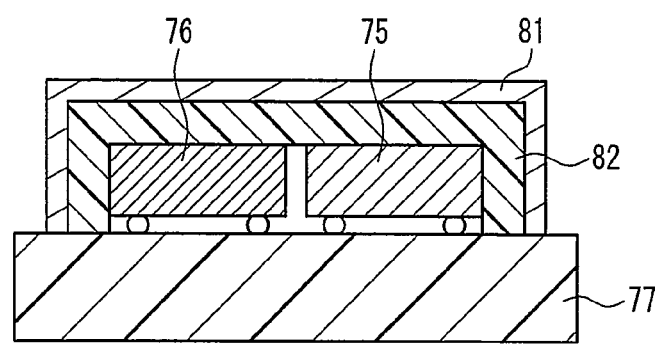
FIG. 15C is a schematic diagram showing an example of a specific configuration of a duplexer module.

FIG. 15C is a cross-sectional view of a duplexer package that is hermetically sealed by resin molding and metallic molding. In the duplexer package shown in FIG. 15C, the transmission filter chip 75 and the reception filter chip 76 are mounted on the ceramic package 77 by flip chip bonding. A resin mold 82 covers the transmission filter chip 75 and the reception filter chip 76, and a metallic coating material covers the resin mold 82. Thereby, the transmission filter chip 75 and the reception filter chip 76 can be sealed hermetically.

The hermetically sealed configurations shown in FIGS. 14, 15A-15C are only examples, and another configuration may be adopted as long as it can at least seal the transmission filter chip and the reception filter chip hermetically.

Figure 16:
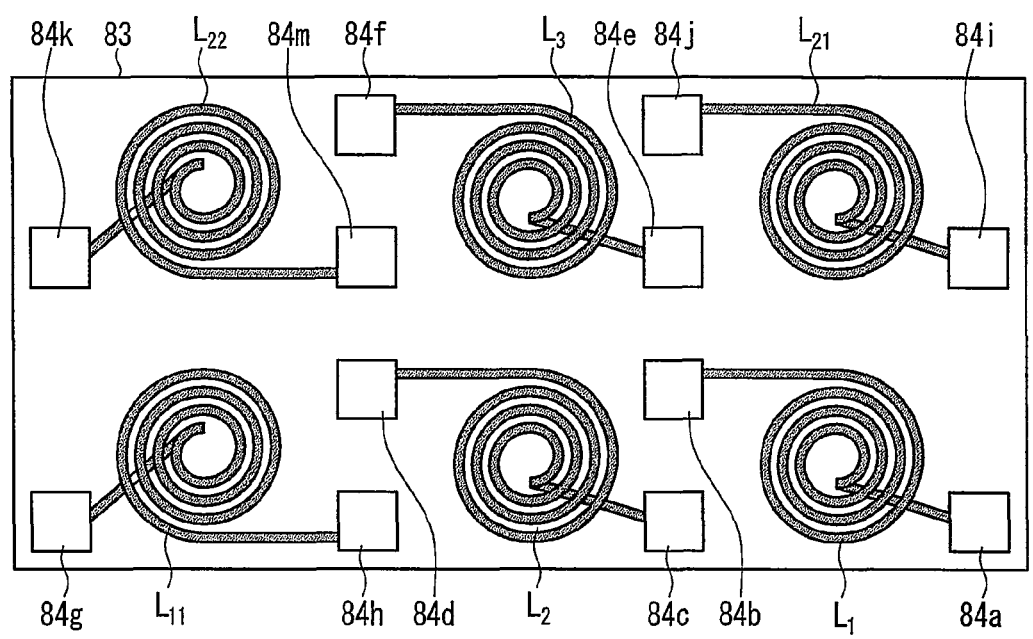
FIG. 16 is a schematic diagram of an example of a chip inductor.

FIG. 16 is a schematic diagram showing an exemplary embodiment of an inductance. The inductance shown in FIG. 16 includes six inductances L1-L3, L11, L21, L22 that are made of chip inductors and formed on a substrate 83. Both ends of the inductance L1 are connected to pads 84a and 84b. Both ends of the inductance L2 are connected to pads 84c and 84d. Both ends of the inductance L3 are connected to pads 84e and 84f. Both ends of the inductance L11 are connected to pads 84g and 84h. Both ends of the inductance L21 are connected to pads 84i and 84j. Both ends of the inductance L22 are connected to pads 84k and 84m. The integration method of the inductances is not limited to chip inductors. The inductances need not be chip parts. The inductances can be formed using wiring on the package or substrate.

Figure 17:
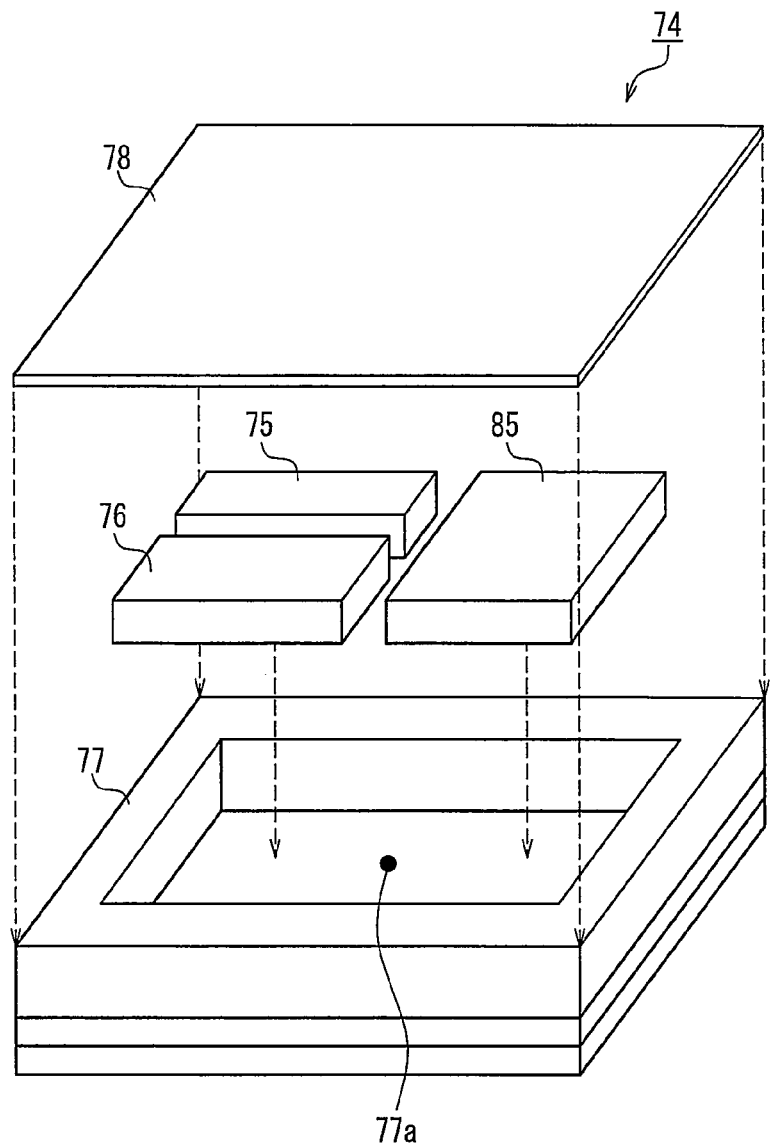
FIG. 17 is an exploded perspective view showing an example of a specific configuration of a duplexer module.

Further, as shown in FIG. 17, the inductance can be formed using an IPD (Integrated Passive Device) 85 formed on the substrate. Since the IPD includes mechanically-weak parts, it is preferable to house it inside the package. The duplexer package 74 shown in FIG. 17 has a configuration in which the IPD 85 is hermetically sealed in the ceramic package 77 together with the transmission filter chip 75 and the reception filter chip 76.

[2. Configuration of Communication Module]

Figure 18:
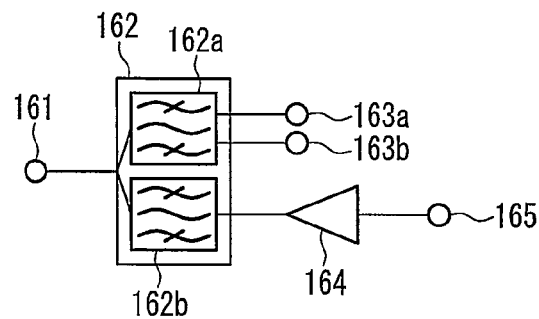
FIG. 18 is a block diagram of an example of a communication module.

FIG. 18 shows an exemplary communication module provided with a filter according to the present embodiment. As shown in FIG. 18, a duplexer 162 includes a reception filter 162a and a transmission filter 162b. The reception filter 162a is connected to, for example, reception terminals 163a and 163b that correspond to a balanced output. The transmission filter 162b is connected to a transmission terminal 165 via a power amplifier 164. Here, the reception filter 162a includes a filter according to the present embodiment.

In the reception operation, the reception filter 162a passes only signals in a predetermined frequency band among reception signals that are input via an antenna terminal 161, and outputs them from the reception terminals 163a and 163b to the outside. Further, in the transmission operation, the transmission filter 162b passes only signals in a predetermined frequency band among transmission signals that are input from the transmission terminal 165 and amplified by the power amplifier 164, and outputs them from the antenna terminal 161 to the outside.

By providing the communication module with the filter according to the present embodiment, it is possible to realize a compact and inexpensive communication module having wideband characteristics while maintaining low loss.

The configuration of the communication module shown in FIG. 18 is only an example, and the same effect can be obtained even when the filter according to the present embodiment is mounted to a communication module having another form.

[3. Configuration of Communication Device]

Figure 19:
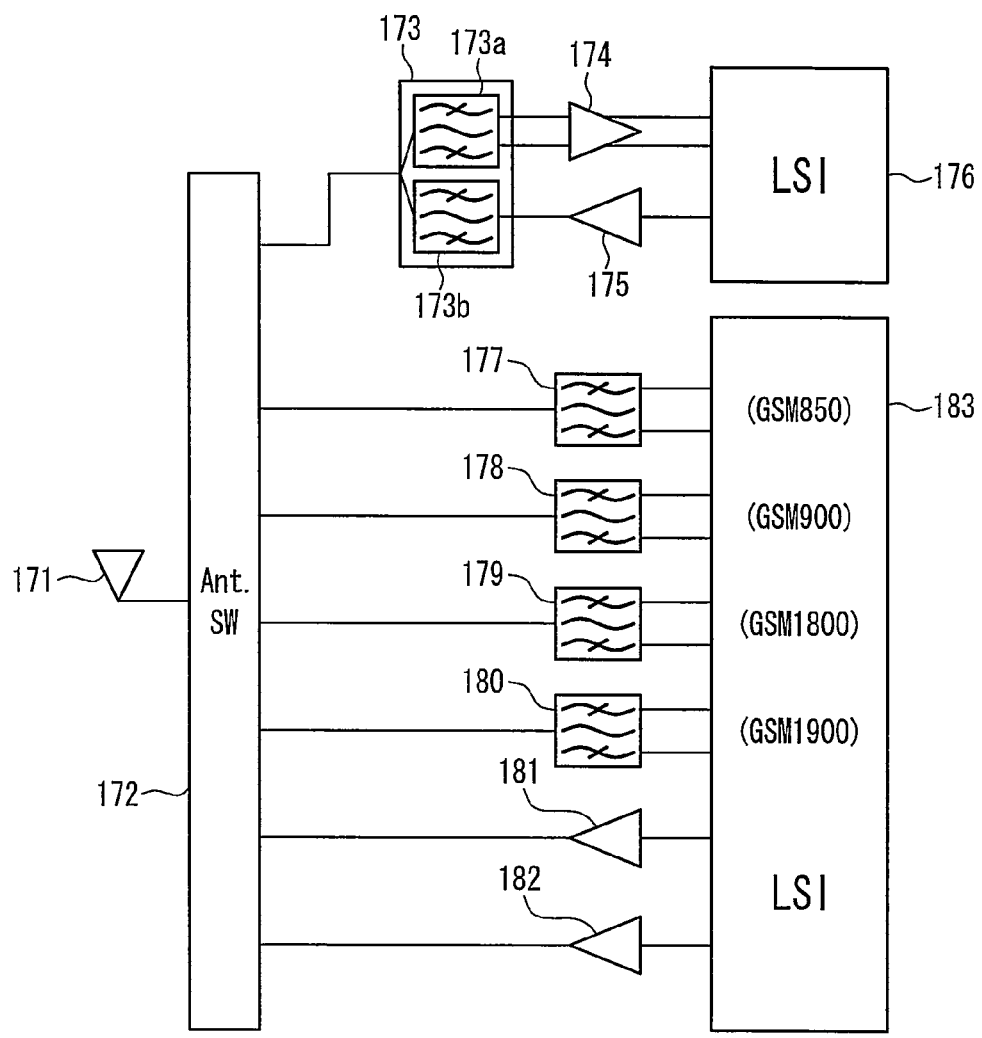
FIG. 19 is a block diagram of an example of a communication device.

FIG. 19 shows a RF block of a mobile phone terminal as an exemplary communication device that is provided with the filter according to the present embodiment or the aforementioned communication module. Further, the communication device shown in FIG. 19 can be a mobile phone terminal corresponding to a GSM (Global System for Mobile) communication system and a W-CDMA (Wideband Code Division Multiple Access) communication system, for example. The GSM communication system in the present embodiment corresponds to the 850 MHz band, the 950 MHz band, the 1.8 GHz band, and the 1.9 GHz band. Although the mobile phone terminal includes a microphone, a speaker, a liquid crystal display, etc., in addition to the configuration shown in FIG. 19, these members are not illustrated since they are unnecessary to the description of the present embodiment. Here, reception filters 173a, 177-180 have the filter configuration according to the present embodiment.

First, depending on whether the communication system of a reception signal input via an antenna 171 is the W-CDMA or GSM, an antenna switching circuit 172 selects an LSI to be operated. When the input reception signal corresponds to the W-CDMA communication system, the antenna switching circuit 172 performs switching so that the reception signal is output to the duplexer 173. The reception filter 173a limits the reception signal input into the duplexer 173 to a predetermined frequency band, whereby a balanced reception signal is output to an LNA 174. The LNA 174 amplifies the input reception signal, and outputs it to an LSI 176. The LSI 176 performs decoding to an audio signal based on the input reception signal, and controls the operations of the respective parts in the mobile phone terminal.

Meanwhile, in the case of transmitting a signal, the LSI 176 generates a transmission signal. The generated transmission signal is amplified by a power amplifier 175 and output to a transmission filter 173*b*. The transmission filter 173*b* passes only signals in a predetermined frequency band among the input transmission signals. The transmission signal output from the transmission filter 173*b* is output via the antenna switching circuit 172 from the antenna 171 to the outside.

When the input reception signal corresponds to the GSM communication system, the antenna switching circuit 172 selects one of the reception filters 177-180 in accordance with the frequency band, and outputs the reception signal to the selected reception filter. The reception signal whose bandwidth has been limited by the one of the reception filters 177-180 is output to an LSI 183. The LSI 183 performs decoding to an audio signal based on the input reception signal, and controls the operations of the respective parts in the mobile phone terminal. In the case of transmitting a signal, the LSI 183 generates a transmission signal. The generated transmission signal is amplified by a power amplifier 181 or 182 and output via the antenna switching circuit 172 from the antenna 171 to the outside.

By providing the communication device with the filter according to the present embodiment or the communication module, it is possible to realize a compact and inexpensive communication device having wideband characteristics while maintaining low loss.

[4. Effects of the Embodiments, Etc.]

According to the present embodiment, it is possible to realize a compact and inexpensive filter, duplexer, communication module and communication device having wideband characteristics while maintaining low loss. Specifically, in the reception filer, the parallel resonator P11 is added in parallel to the series arm, and the inductance L11 is connected in series to the parallel resonator P11. Further, the resonance frequency of the parallel resonator P11 coincides with the resonance frequencies of the series resonators in the filter and is lower than the resonance frequencies of the other parallel resonators. Thereby, the passband of the filter can be included between the resonance frequency and the antiresonance frequency of the parallel resonator P11, which realizes a wider bandwidth while maintaining low loss.

Further, since an inductance need not be connected to each of the plurality of the resonators provided in the filter, it is possible to realize a compact and inexpensive filter.

The series resonators S1-S4 in the present embodiment are exemplary series resonators of the present application. The parallel resonators P1-P4 in the present embodiment are exemplary parallel resonators of the present application. The inductance L11 in the present embodiment is an exemplary inductance of the present application. The parallel resonator P11 in the present embodiment is an exemplary parallel resonator to which the inductance of the present application is connected in series.

The present application is useful for a filter, a duplexer, a communication module and a communication device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A filter, comprising:
   a filter circuit having a prescribed passband and including:
      a plurality of series resonators; and
      a plurality of first parallel resonators; and
   an impedance matching circuit including:
      a second parallel resonator; and
      an inductance that is connected in series to the second parallel resonator,
   wherein the second parallel resonator is connected in parallel to at least one of the plurality of first parallel resonators that has no inductance connected thereto without any one of the plurality of series resonators interposed therebetween in a series arm to which the second parallel resonator and said at least one of the plurality of first parallel resonators are connected,
   wherein an antiresonance frequency of the second parallel resonator in the impedance matching circuit is equal to or higher than an antiresonance frequency of at least one of the series resonators and is equal to or higher than a highest frequency of the prescribed passband of the filter circuit,
   wherein a resonance frequency of the second parallel resonator in the impedance matching circuit is shifted by the inductance so that a resonance frequency of the impedance matching circuit is equal to or lower than a resonance frequency of at least one of the first parallel resonators and is equal to or lower than a lowest frequency of the prescribed passband of the filter circuit.

2. The filter according to claim 1, wherein the plurality of series resonators include a plurality of series resonators having resonance frequencies different from each other, and the antiresonance frequency of the second parallel resonator in the impedance matching circuit is equal to or higher than an antiresonance frequency of the series resonator having the lowest resonance frequency among the plurality of series resonators.

3. The filter according to claim 1, wherein the plurality of first parallel resonators includes a plurality of parallel resonators having resonance frequencies different from each other, and the resonance frequency of the second parallel resonator in the impedance maching circuit that is shifted by the inductance is equal to or lower than a resonance frequency of the first parallel resonator having the highest resonance frequency among the plurality of parallel resonators.

4. The filter according to claim 1, wherein each of the series resonators and each of the first and second parallel resonators has a laminated film configuration of a film bulk acoustic resonator.

5. A duplexer, comprising:
   a transmission filter; and
   a reception filter,
   wherein the reception filter is the filter according to claim 1.

6. A communication module that is provided with a filter of claim 1.

7. A communication device that is provided with a filter of claim 1.

* * * * *